(12) United States Patent
Fujita

(10) Patent No.: US 10,457,608 B2
(45) Date of Patent: Oct. 29, 2019

(54) MULTILAYER CERAMIC SUBSTRATE AND ELECTRONIC DEVICE

(71) Applicant: Murata Manufacturing Co., Ltd., Nagaokakyo-shi, Kyoto-fu (JP)

(72) Inventor: Seiji Fujita, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 3 days.

(21) Appl. No.: 16/182,784

(22) Filed: Nov. 7, 2018

(65) Prior Publication Data

US 2019/0071365 A1 Mar. 7, 2019

Related U.S. Application Data

(63) Continuation of application No. PCT/JP2017/016330, filed on Apr. 25, 2017.

(30) Foreign Application Priority Data

May 17, 2016 (JP) .................. 2016-098996

(51) Int. Cl.
*C04B 37/04* (2006.01)
*H05K 3/46* (2006.01)
(Continued)

(52) U.S. Cl.
CPC ............ *C04B 37/042* (2013.01); *B32B 17/06* (2013.01); *C03C 14/004* (2013.01);
(Continued)

(58) Field of Classification Search
CPC ....... B32B 18/00; C03C 14/004; C03C 3/064; C03C 3/091; C03C 8/14;
(Continued)

(56) References Cited

U.S. PATENT DOCUMENTS 5,827,605 A * 10/1998 Nishide .................. B32B 17/00
428/209
5,955,938 A * 9/1999 Fukaya .................. H01L 28/24
257/E21.006
(Continued)

FOREIGN PATENT DOCUMENTS

JP 2007073728 A 3/2007
JP 2012167008 A 9/2012

OTHER PUBLICATIONS

International Search Report issued for PCT/JP2017/016330, dated Aug. 1, 2017.
(Continued)

*Primary Examiner* — William H. Mayo, III
*Assistant Examiner* — Rhadames Alonzo Miller
(74) *Attorney, Agent, or Firm* — Arent Fox LLP

(57) ABSTRACT

A multilayer ceramic substrate that includes a surface layer portion positioned on an internal layer portion, and a surface layer electrode on a surface of the surface layer portion. The surface layer portion includes a first layer next to the internal layer portion, and the internal layer portion includes a second layer next to the first layer. The thermal expansion coefficient of the first layer is lower than the thermal expansion coefficient of the second layer. The first layer and the second layer each contain glass containing 40 weight % to 65 weight % of MO, where MO is at least one selected from CaO, MgO, SrO, and/or BaO); 35 weight % to 60 weight % of alumina, and 1 weight % to 10 weight % of at least one metal oxide selected from CuO and/or $Ag_2O$.

18 Claims, 2 Drawing Sheets

(51) Int. Cl.

| | |
|---|---|
| *B32B 17/06* | (2006.01) |
| *C03C 14/00* | (2006.01) |
| *C04B 37/00* | (2006.01) |
| *H05K 1/03* | (2006.01) |
| *H05K 1/11* | (2006.01) |
| *H01L 23/538* | (2006.01) |
| *C03C 3/064* | (2006.01) |
| *C03C 3/091* | (2006.01) |
| *C03C 12/00* | (2006.01) |
| *H01L 23/15* | (2006.01) |
| *C03B 23/203* | (2006.01) |
| *H05K 1/09* | (2006.01) |
| *H05K 1/18* | (2006.01) |

(52) U.S. Cl.
CPC ......... *C04B 37/001* (2013.01); *H05K 1/0306* (2013.01); *H05K 1/112* (2013.01); *H05K 3/4655* (2013.01); *C03B 23/203* (2013.01); *C03C 2214/04* (2013.01); *C04B 2237/343* (2013.01); *H05K 1/09* (2013.01); *H05K 1/181* (2013.01); *H05K 2201/0175* (2013.01); *H05K 2201/0195* (2013.01); *H05K 2201/068* (2013.01); *H05K 2201/10015* (2013.01); *H05K 2201/10522* (2013.01); *H05K 2203/068* (2013.01)

(58) Field of Classification Search
CPC ...... C04B 2235/3208; C04B 2237/343; C04B 2237/582; C04B 35/117; H05K 1/0271; H05K 1/0306; H05K 2201/068; H05K 3/46; H05K 3/4605
See application file for complete search history.

(56) References Cited

U.S. PATENT DOCUMENTS

| | | | | |
|---|---|---|---|---|
| 6,414,247 | B1* | 7/2002 | Nakai | C03C 14/004 |
| | | | | 174/250 |
| 2003/0113554 | A1* | 6/2003 | Umayahara | B32B 17/06 |
| | | | | 428/446 |
| 2003/0118842 | A1* | 6/2003 | Moriya | C03C 14/004 |
| | | | | 428/428 |
| 2007/0224400 | A1* | 9/2007 | Meguro | H01L 21/4807 |
| | | | | 428/209 |
| 2007/0248801 | A1* | 10/2007 | Nakao | H01L 21/4807 |
| | | | | 428/210 |
| 2009/0011249 | A1* | 1/2009 | Sakamoto | H05K 3/4629 |
| | | | | 428/428 |
| 2010/0151217 | A1* | 6/2010 | Kanada | H01L 23/15 |
| | | | | 428/217 |
| 2011/0117360 | A1* | 5/2011 | Izumi | C04B 35/16 |
| | | | | 428/329 |
| 2011/0223399 | A1* | 9/2011 | Adachi | C04B 35/20 |
| | | | | 428/212 |
| 2011/0266036 | A1* | 11/2011 | Iida | B32B 18/00 |
| | | | | 174/255 |
| 2012/0267037 | A1* | 10/2012 | Kishida | B32B 18/00 |
| | | | | 156/89.12 |
| 2016/0088729 | A1* | 3/2016 | Kobuke | H05K 3/4629 |
| | | | | 174/251 |
| 2018/0072627 | A1* | 3/2018 | Kato | C04B 35/195 |

OTHER PUBLICATIONS

Written Opinion of the International Searching Authority issued for PCT/JP2017/016330, dated Aug. 1, 2017.

* cited by examiner

MULTILAYER CERAMIC SUBSTRATE AND ELECTRONIC DEVICE

CROSS REFERENCE TO RELATED APPLICATIONS

The present application is a continuation of International application No. PCT/JP2017/016330, filed Apr. 25, 2017, which claims priority to Japanese Patent Application No. 2016-098996, filed May 17, 2016, the entire contents of each of which are incorporated herein by reference.

FIELD OF THE INVENTION

The present invention relates to a multilayer ceramic substrate and an electronic device.

BACKGROUND OF THE INVENTION

In recent years, multilayer ceramic substrates in which wire conductors are three dimensionally disposed have been widely used for modules in which a plurality of electric components, such as semiconductor components, are disposed. Patent Document 1 discloses a multilayer ceramic substrate having a multilayer structure including an internal layer portion and surface layer portions positioned so as to sandwich the internal layer portion in a laminating direction. In the multilayer ceramic substrate, needle-like crystals are deposited in the internal layer portion, and when the thermal expansion coefficient of the surface layer portions is denoted by $\alpha 1$ (ppmK$^{-1}$) and the thermal expansion coefficient of the internal layer portion is denoted by $\alpha 2$ (ppmK$^{-1}$), $0.3 \leq \alpha 2 - \alpha 1 \leq 1.5$. Patent Document 2 discloses a multilayer ceramic substrate having a multilayer structure including surface layer portions and an internal layer portion. In the multilayer ceramic substance, the thermal expansion coefficient of the surface layer portion is lower than the thermal expansion coefficient of the internal layer portion, and the difference in thermal expansion coefficient is 1.0 ppmK$^{-1}$ or more. The weight percentage of a component common to the material forming the surface layer portions and the material forming the internal layer portion is 75 weight % or more.

According to multilayer ceramic substrates described in Patent Documents 1 and 2, setting the thermal expansion coefficient of the surface layer portions lower than the thermal expansion coefficient of the internal layer portion causes compressive stress on outermost layers on the front and back sides during a cooling process after firing. Thus, it is assumed that the flexural strength of the multilayer ceramic substrate is improved.

Patent Document 1: Japanese Unexamined Patent Application Publication No. 2007-73728

Patent Document 2: International Publication No. 2007/142112

SUMMARY OF THE INVENTION

In recent years, as the size of electronic devices has been reduced, reduction in the thickness of multilayer ceramic substrates and the thickness of wires has been promoted. In the multilayer ceramic substrates described in Patent Documents 1 and 2, flexural strength is improved by disposing a layer having a thermal expansion coefficient lower than that of the internal layer portion on a surface layer portion of the internal layer portion. This enables reduction in the thickness of the multilayer ceramic substrate. However, in the multilayer ceramic substrates described in Patent Documents 1 and 2, it has been found that pores (voids) may be generated in the surface layer portion and the internal layer portion and thus, disconnection may occur in a surface layer electrode disposed on the surface of the surface layer portion. To promote reduction in the thickness of multilayer ceramic substrates and the thickness of wires hereafter, it is necessary that such disconnection of the surface layer electrode be suppressed.

The present invention solves the above-described problems and provides a multilayer ceramic substrate in which disconnection of a surface layer electrode is suppressed, and to provide an electronic device including the multilayer ceramic substrate.

To achieve the foregoing objects, a multilayer ceramic substrate according to an aspect of the present invention includes a multilayer structure including a surface layer portion positioned on the surface and an internal layer portion positioned inward of the surface layer portion and a surface layer electrode disposed on the surface of the surface layer portion. The surface layer portion includes a first layer next to the internal layer portion, and the internal layer portion includes a second layer next to the first layer. The thermal expansion coefficient of the first layer is lower than the thermal expansion coefficient of the second layer. Materials forming the first layer and the second layer each contain glass containing 40 weight % to 65 weight % of MO relative to a total weight of the glass (wherein MO is at least one selected from CaO, MgO, SrO, and/or BaO), alumina, and at least one metal oxide selected from CuO and/or $Ag_2O$. The amount of the alumina is 35 weight % to 60 weight % relative to the total weight of the glass and the alumina. The amount of the metal oxide is 1 weight % to 10 weight % relative to the total weight of the glass and the alumina.

The material forming the first layer in the surface layer portion and the material forming the second layer in the internal layer portion each contain a predetermined amount of at least one metal oxide selected from a group consisting of CuO and $Ag_2O$. This promotes vitrification in the first layer, and thus, the first layer is densified. As a result, generation of pores is suppressed in the first layer, thereby suppressing disconnection of the surface layer electrode.

The amount of the metal oxide in the first layer is preferably more than the amount of the metal oxide in the second layer.

If the second layer includes excessive amount of the metal oxide, vitrification in the second layer proceeds excessively. Thus, organic components are not sufficiently degraded in firing, and pores are likely to be generated in the second layer. In this case, disconnection of the surface layer electrode can be suppressed; however, insulating properties of the internal layer portion may be degraded. Therefore, the amount of the metal oxide in the first layer is preferably set to be more than the amount of the metal oxide in the second layer, thereby suppressing disconnection of the surface layer electrode and obtaining insulating properties of the internal layer portion reliably.

In the multilayer ceramic substrate according to an aspect of the present invention, when the thermal expansion coefficient of the first layer is denoted by $\alpha 1$ (ppmK$^{-1}$) and the thermal expansion coefficient of the second layer is denoted by $\alpha 2$ (ppmK$^{-1}$), it is preferable that $0.3 \leq \alpha 2 - \alpha 1 \leq 1.5$ be satisfied, more preferably $0.4 \leq \alpha 2 - \alpha 1 \leq 1.4$, and still more preferably $0.5 \leq \alpha 2 - \alpha 1 \leq 1.3$.

Setting the difference in thermal expansion coefficient, $\alpha 2 - \alpha 1$, to 0.3 or more increases the flexural strength of the multilayer ceramic substrate. Setting the difference in thermal expansion coefficient, α2−α1, to 1.5 suppresses the increase in stress at the interface between the first layer and the second layer, and thus, occurrence of delamination at the interface is suppressed.

In the multilayer ceramic substrate according to an aspect of the present invention, the thermal expansion coefficient α1 (ppmK$^{-1}$) of the first layer is preferably 5.0≤α1≤8.0 and more preferably 5.3≤α1≤7.7.

In the multilayer ceramic substrate according to an aspect of the present invention, the thermal expansion coefficient α2 (ppmK$^{-1}$) of the second layer is preferably 5.5≤α2≤8.5 and more preferably 5.7≤α2≤8.0.

An electronic device according to an aspect of the present invention includes the multilayer ceramic substrate.

The above-described inventions provide a multilayer ceramic substrate in which disconnection of a surface layer electrode is suppressed, as well as an electronic device including the multilayer ceramic substrate.

DETAILED DESCRIPTION OF THE PREFERRED EMBODIMENTS

Hereinafter, according to the present invention, a multilayer ceramic substrate and an electronic device will be described.

However, the present invention is not limited to the following structures. Various modifications may be appropriately made as long as the gist of the present invention is not changed. A combination of two or more of individual preferred embodiments of the present invention described below is also included in the present invention.

Figure 1:
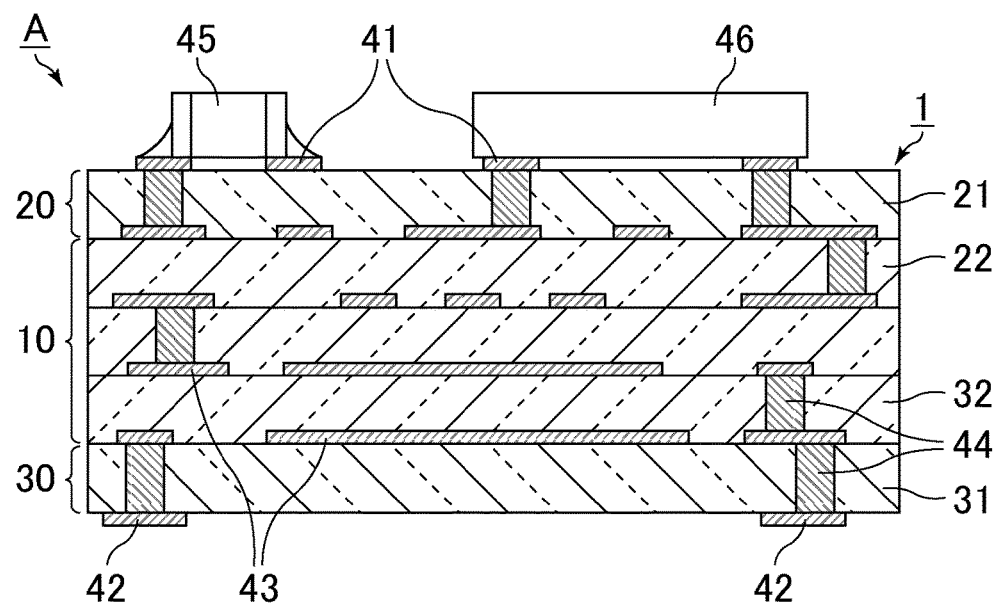
FIG. 1 is a schematic cross-sectional view of an electronic device including a multilayer ceramic substrate according to an embodiment of the present invention.

FIG. 1 is a schematic cross-sectional view of an electronic device including a multilayer ceramic substrate according to an embodiment of the present invention.

A multilayer ceramic substrate 1 includes a multilayer structure including an internal layer portion 10 and a first surface layer portion 20 and a second surface layer portion 30 that are positioned so as to sandwich the internal layer portion 10 in a laminating direction.

The internal layer portion 10, the first surface layer portion 20, and the second surface layer portion 30 each include at least one ceramic layer. The first surface layer portion 20 includes a first layer 21 next to the internal layer portion 10. The second surface layer portion 30 includes a first layer 31 next to the internal layer portion 10. The internal layer portion 10 includes a second layer 22 next to the first layer 21 disposed in the first surface layer portion 20 and a second layer 32 next to the first layer 31 disposed in the second surface layer portion 30.

The multilayer ceramic substrate 1 includes wire conductors. The wire conductors are used to form a passive element, such as a capacitor or an inductor, or to establish a connection, such as an electrical connection between elements. As illustrated in the figure, the wire conductors typically include surface layer electrodes 41 and 42, internal conductors 43, and via-hole conductors 44. It is preferable that such wire conductors contain mainly Ag, Cu, Au, a Ag—Pd alloy, or a Ag—Pt alloy. It is more preferable that such wire conductors contain mainly Ag.

The surface layer electrodes 41 and 42 are respectively formed on one main surface and the other main surface of the multilayer ceramic substrate 1. The internal conductors 43 are formed in the multilayer ceramic substrate 1 and disposed between the ceramic layers. Via-hole conductors 44 are each electrically connected to any of the surface layer electrodes 41 and 42 and the internal conductors 43 and disposed so as to pass through a ceramic layer in a thickness direction.

A multilayer ceramic capacitor 45 and a semiconductor component 46, which are chip-like electronic components, are mounted on one main surface of the multilayer ceramic substrate 1, while each being electrically connected to the surface layer electrodes 41. This forms an electronic device A including the multilayer ceramic substrate 1. The surface layer electrodes 42 formed on the other main surface of the multilayer ceramic substrate 1 are used as electrical connection means when the electronic device A is mounted on a motherboard not illustrated in the figure.

In the multilayer ceramic substrate according to the present invention, the thermal expansion coefficient of the first layer is lower than the thermal expansion coefficient of the second layer. When the thermal expansion coefficient of the first layer is denoted by α1 (ppmK$^{-1}$) and the thermal expansion coefficient of the second layer is denoted by α2 (ppmK$^{-1}$), it is preferable that 0.3≤α2−α1≤1.5 be satisfied. The lower limit of the thermal expansion coefficient difference, which is α2−α1, is more preferably 0.4, still more preferably 0.5, and particularly preferably 0.6. The upper limit is more preferably 1.4 and still more preferably 1.3.

The thermal expansion coefficient is a value obtained by performing measurement by thermomechanical analysis (TMA) with the temperature raised from room temperature to 500° C. at a rate of 5° C./min.

The lower limit of the thermal expansion coefficient α1 of the first layer is preferably 5.0 ppmK$^{-1}$ and more preferably 5.3 ppmK$^{-1}$, and the upper limit is preferably 8.0 ppmK$^{-1}$ and more preferably 7.7 ppmK$^{-1}$. The lower limit of the thermal expansion coefficient α2 of the second layer is preferably 5.5 ppmK$^{-1}$ and more preferably 5.7 ppmK$^{-1}$, the upper limit is preferably 8.5 ppmK$^{-1}$ and more preferably 8.0 ppmK$^{-1}$.

As described later, a mixture of glass, alumina, and a metal oxide is used as the material for a surface-layer-portion ceramic layer forming the surface layer portion and as the material for an internal-layer-portion ceramic layer forming the internal layer portion. The thermal expansion coefficients of the first layer and the second layer can be individually adjusted by changing the proportion of glass, alumina, and the metal oxide or changing the type of glass and/or the type of the metal oxide.

The materials forming the first layer and the second layer each contain glass. Specifically, glasses forming the first layer and the second layer each contain 40 weight % to 65 weight % of MO (MO is at least one selected from a group consisting of CaO, MgO, SrO, and BaO) relative to the total weight of the glass. It is preferable that glasses forming the first layer and the second layer each further contain $Al_2O_3$, $B_2O_3$, and $SiO_2$.

The thermal expansion coefficient of the first layer can be adjusted by adjusting the composition of the glass and the amount of each component contained in the material forming the first layer. The thermal expansion coefficient of the second layer can be adjusted by adjusting the composition of the glass and the amount of each component contained in the material forming the second layer.

The preferable proportion of the amount of each component contained in the glass forming the first layer is as follows.

MO (preferably CaO): 40 weight % to 55 weight %, more preferably 41 weight % to 50 weight %

$Al_2O_3$: 0 weight % to 10 weight %, more preferably 3 weight % to 8.5 weight %

$B_2O_3$: 0 weight % to 20 weight %, more preferably 3 weight % to 15 weight %

$SiO_2$: 25 weight % to 70 weight %, more preferably 30 weight % to 60 weight %

The preferable proportion of the amount of each component contained in the glass forming the second layer is as follows.

MO (preferably, CaO): 40 weight % to 55 weight %, more preferably 41 weight % to 50 weight %

$Al_2O_3$: 0 weight % to 10 weight %, more preferably 3 weight % to 8.5 weight %

$B_2O_3$: 0 weight % to 20 weight %, more preferably 3 weight % to 15 weight %

$SiO_2$: 25 weight % to 70 weight %, more preferably 30 weight % to 60 weight %

The glasses forming the first layer and the second layer may each contain other impurities. When impurities are contained, the amount of impurities is preferably less than 5 weight %.

The materials forming the first layer and the second layer each contain alumina ($Al_2O_3$) serving as a ceramic filler. The $Al_2O_3$ filler contributes to improving mechanical strength.

The materials forming the first layer and the second layer each contain 35 weight % to 60 weight % of alumina relative to the total weight of the glass and the alumina.

The material forming the first layer preferably contains 48 weight % to 60 weight % of alumina relative to the total weight of the glass and the alumina. The material forming the second layer preferably contains 48 weight % to 60 weight % of alumina relative to the total weight of the glass and the alumina.

The materials forming the first layer and the second layer each contain at least one metal oxide selected from a group consisting of CuO and $Ag_2O$. The materials forming the first layer and the second layer each preferably contain any one of CuO and $Ag_2O$. In this case, one of the materials forming the first layer and the second layer may contain CuO, and the other may contain $Ag_2O$; however, both materials preferably contain the same metal oxide. CuO and $Ag_2O$ each contain a metal element (Cu or Ag) common to wire conductors. The materials forming the first layer and the second layer do not necessarily contain a metal oxide containing a metal element the same as the metal element contained in wire conductors. For example, when wire conductors contain mainly Ag, the materials forming the first layer and the second layer may contain CuO.

The materials forming the first layer and the second layer each contain 1 weight % to 10 weight % of a metal oxide relative to the total weight of the glass and the alumina. The amount of the metal oxide in the first layer is preferably more than the amount of the metal oxide in the second layer.

The material forming the first layer preferably contains 3 weight % to 5 weight % of a metal oxide relative to the total weight of the glass and the alumina. The material forming the second layer preferably contains 1 weight % to 2 weight % of a metal oxide relative to the total weight of the glass and the alumina.

In particular, the material forming the first layer preferably contains 48 weight % to 60 weight % of alumina and 3 weight % to 5 weight % of a metal oxide relative to the total weight of the glass and the alumina. The material forming the second layer preferably contains 48 weight % to 60 weight % of alumina and 1 weight % to 2 weight % of a metal oxide relative to the total weight of the glass and the alumina.

The materials forming the first layer and the second layer may each contain another ceramic filler, such as $ZrO_2$, in addition to $Al_2O_3$, CuO, and $Ag_2O$.

When the surface layer portion includes a ceramic layer in addition to the first layer, the ceramic layer other than the first layer may be formed of a material different from the material for the first layer; however, at least the outermost layer is preferably formed of a material the same as the material for the first layer. More preferably, all ceramic layers are formed of a material the same as the material for the first layer. When the internal layer portion includes a ceramic layer in addition to the second layer, the ceramic layer other than the second layer may be formed of a material different from the material for the second layer; however, all ceramic layers are preferably formed of a material the same as the material for the second layer.

In the multilayer ceramic substrate 1 illustrated in FIG. 1, the surface layer electrodes 41 and the surface layer electrodes 42 are respectively disposed on the surface of the first surface layer portion 20 and the surface of the second surface layer portion 30. The first surface layer portion 20 and the second surface layer portion 30 respectively include the first layer 21 and the first layer 31. In the multilayer ceramic substrate according to the present invention, the surface layer electrodes are required to be disposed on the surface of at least one surface layer portion, and the surface layer portion, on which surface layer electrodes are disposed, is required to include the above-described first layer.

The multilayer ceramic substrate 1 illustrated in FIG. 1 is preferably produced as follows.

Figure 2:
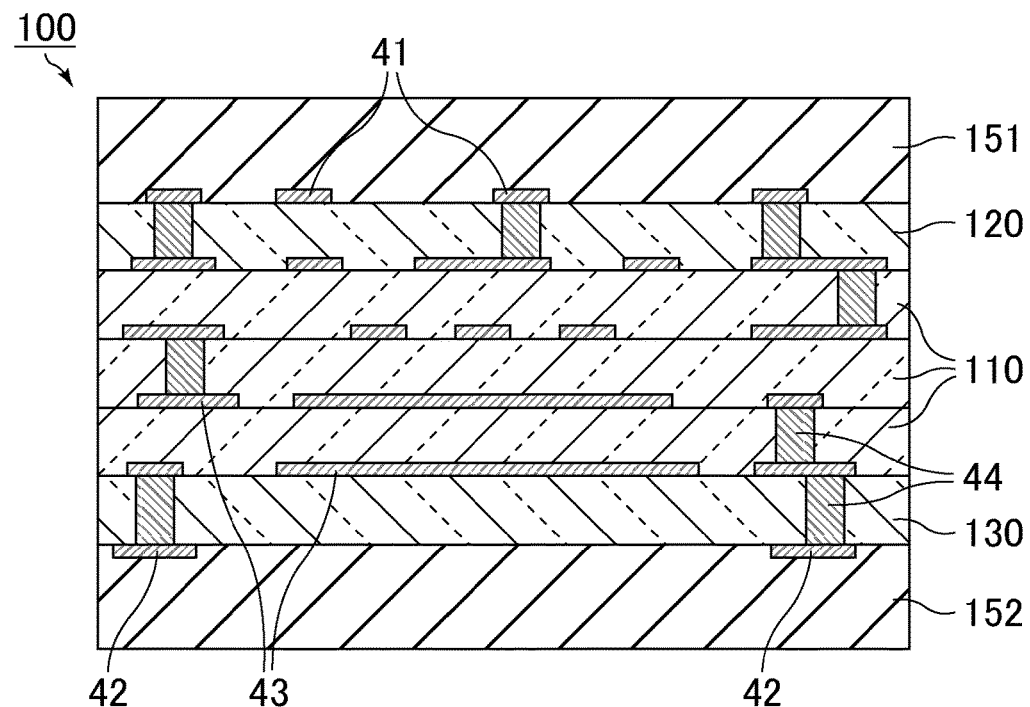
FIG. 2 is a schematic cross-sectional view of a composite multilayer body produced in a process of producing the multilayer ceramic substrate illustrated in FIG. 1.

FIG. 2 is a schematic cross-sectional view of a composite multilayer body produced in a process of producing the multilayer ceramic substrate illustrated in FIG. 1.

A composite multilayer body 100 includes restraint ceramic green sheets 151 and 152 in addition to internal ceramic green sheets 110, which are to be the internal layer portion 10, a surface ceramic green sheet 120, which is to be the surface layer portion 20, and a surface ceramic green sheet 130, which is to be the surface layer portion 30 in the multilayer ceramic substrate 1. In the internal ceramic green sheets 110 and the surface ceramic green sheets 120 and 130, the surface layer electrodes 41 and 42, the internal conductors 43, and the via-hole conductors 44 are disposed as wire conductors included in the multilayer ceramic substrate 1. In this step, such wire conductors are formed of an unsintered conductive paste.

At first, to produce the composite multilayer body 100, the internal ceramic green sheets 110, the surface ceramic green sheets 120 and 130, and the restraint ceramic green sheets 151 and 152 are provided.

The compositions of the ceramic green sheets 110, 120, and 130 are each selected such that the thermal expansion coefficient of sintered bodies of the surface ceramic green sheets 120 and 130, which are to be the first layers, is lower than the thermal expansion coefficient of the sintered bodies of the internal ceramic green sheets 110, which are to be the second layers. The compositions of the ceramic green sheets 110, 120, and 130 are also each selected such that each of the materials forming the surface ceramic green sheets 120 and 130, which are to be the first layers, and the internal ceramic green sheets 110, which are to be the second layers, contains glass containing 40 weight % to 65 weight % of MO (MO is at least one selected from a group consisting of CaO, MgO, SrO and BaO), alumina, and at least one metal oxide selected from a group consisting of CuO and $Ag_2O$. The amount of the alumina is 35 weight % to 60 weight % relative to the total weight of the glass and the alumina. The amount of the metal oxide is 1 weight % to 10 weight % relative to the total weight of the glass and the alumina.

The restraint ceramic green sheets 151 and 152 have a composition in which an inorganic material (e.g., $Al_2O_3$) is the main component. The inorganic material is not sintered at a temperature at which the internal ceramic green sheets 110 and the surface ceramic green sheets 120 and 130 are sintered.

Next, the surface ceramic green sheets 120 and 130 are disposed so as to sandwich at least one of the internal ceramic green sheets 110 in a laminating direction. Then, the restraint ceramic green sheets 151 and 152 are respectively disposed on the outside of the surface ceramic green sheets 120 and the outside of the surface ceramic green sheet 130 to produce the composite multilayer body 100 illustrated in FIG. 2.

Subsequently, the composite multilayer body 100 is fired at a temperature at which the surface ceramic green sheets 120 and 130 and the internal ceramic green sheets 110 are sintered and at which the restraint ceramic green sheets 151 and 152 are not sintered. As a result, the fired composite multilayer body 100 is obtained. In the fired composite multilayer body 100, the thermal expansion coefficient of the first layers 21 and 31 (see FIG. 1), which are respectively derived from the surface ceramic green sheets 120 and 130, is lower than the thermal expansion coefficient of the second layers 22 and 32 (see FIG. 1), which are derived from the internal ceramic green sheets 110. The materials forming the first layers 21 and 31 and the second layers 22 and 32 (see FIG. 1) each contain glass containing 40 weight % to 65 weight % of MO (MO is at least one selected from a group consisting of CaO, MgO, SrO, and BaO), alumina, and at least one metal oxide selected from a group consisting of CuO and $Ag_2O$. The amount of the alumina is 35 weight % to 60 weight % relative to the total weight of the glass and the alumina. The amount of the metal oxide is 1 weight % to 10 weight % relative to the total weight of the glass and the alumina.

Next, portions derived from the restraint ceramic green sheets 151 and 152 are removed from the fired composite multilayer body 100. This provides the multilayer ceramic substrate 1.

According to the above-described production method, a composite multilayer body in which a restraint ceramic green sheet is disposed on each main surface is fired. This suppresses shrinkage, during firing, of the surface ceramic green sheets and the internal ceramic green sheets in a direction of each main surface. Therefore, undesired deformation of the multilayer ceramic substrate is suppressed, and thus, size accuracy is improved. In addition, delamination between the surface layer portion and the internal layer portion is unlikely to occur during firing.

On the other hand, when a composite multilayer body in which a restraint ceramic green sheet is disposed on each main surface is fired, typically, a glass component contained in a surface ceramic green sheet is likely to be absorbed in the restraint ceramic green sheet. This may lead to generation of pores in the surface layer portion. However, in the present invention, the surface ceramic green sheets, which are to be the first layers, and the internal ceramic green sheets, which are to be the second layers, contain a predetermined amount of at least one metal oxide selected from a group consisting of CuO and $Ag_2O$. This promotes vitrification in the first layer and thus, the first layer is densified. As a result, generation of pores is suppressed in the first layer, thereby suppressing disconnection of a surface layer electrode.

In producing the multilayer ceramic substrate 1, the above-described restraint ceramic green sheets 151 and 152 are not necessarily used, and a multilayer body without restraint ceramic green sheets may be fired. This also suppresses disconnection of a surface layer electrode.

EXAMPLES

Hereinafter, Examples in which the multilayer ceramic substrate according to the present invention is more specifically disclosed will be described. The present invention is not limited to such Examples.

(Production of Multilayer Ceramic Substrate)

First, $SiO_2$—CaO—$B_2O_3$—$Al_2O_3$-based glass powders having compositions shown in Table 1 were provided.

TABLE 1

| Glass symbol | CaO (weight %) | $Al_2O_3$ (weight %) | $B_2O_3$ (weight %) | $SiO_2$ (weight %) |
|---|---|---|---|---|
| G1 | 45 | 7 | 6 | 42 |
| G2 | 47 | 4 | 11 | 38 |
| G3 | 50 | 3 | 14 | 33 |

Next, to obtain the samples shown in Table 2, surface ceramic green sheets and internal ceramic green sheets were produced.

To obtain each sample shown in Table 2, a solvent, a dispersant, a binder, and a plasticizer were blended with a powder mixture containing the glass powder, an alumina ($Al_2O_3$) powder, and a powder of a metal oxide, such as CuO or $Ag_2O$, and mixed together to obtain a slurry. The obtained slurry was applied to PET films to produce surface ceramic green sheets and internal ceramic green sheets.

Table 2 shows the type and amount of the glass powder, the amount of an $Al_2O_3$ powder, and the amount of a metal oxide powder that are contained in each of the surface ceramic green sheets and the internal ceramic green sheets. In Table 2, each of the symbols "G1" to "G3" representing the type of the glass corresponds to "glass symbol" in Table 1. As shown in Table 2, the weight ratio of the glass powder to the $Al_2O_3$ powder was adjusted to 46:54 to 60:40. The thickness of the surface ceramic green sheets and the thickness of the internal ceramic green sheets were respectively adjusted so as to obtain the thickness of the first layers (surface layers) and the thickness of the second layers (internal layers), which are shown in Table 2, after firing.

TABLE 2

| | First layer (Surface layer) | | | | | Second layer (Internal layer) | | | | |
|---|---|---|---|---|---|---|---|---|---|---|
| | Glass | $Al_2O_3$ | CuO | $Ag_2O$ | | Glass | $Al_2O_3$ | CuO | $Ag_2O$ | |
| | Type | Parts by weight | Parts by weight | Parts by weight | Parts by weight | Thickness μm | Type | Parts by weight | Parts by weight | Parts by weight | Parts by weight | Thickness μm |
| Comparative Example 1 | G1 | 48 | 52 | — | — | 12.0 | G1 | 52 | 48 | — | — | 11.0 |
| Comparative Example 2 | G1 | 48 | 52 | 1 | — | 12.0 | G1 | 52 | 48 | — | — | 11.0 |
| Example 1 | G1 | 48 | 52 | 3 | — | 12.0 | G1 | 52 | 48 | 1 | — | 11.0 |
| Example 2 | G1 | 48 | 52 | 3 | — | 12.0 | G1 | 52 | 48 | 3 | — | 11.0 |
| Example 3 | G1 | 48 | 52 | 3 | — | 12.0 | G1 | 52 | 48 | 4 | — | 11.0 |
| Example 4 | G3 | 60 | 40 | 3 | — | 12.0 | G1 | 60 | 40 | 1 | — | 11.0 |
| Example 5 | G3 | 46 | 54 | 5 | — | 12.0 | G1 | 46 | 54 | 2 | — | 11.0 |
| Example 6 | G1 | 48 | 52 | 5 | — | 12.0 | G1 | 52 | 48 | 2 | — | 11.0 |
| Example 7 | G1 | 48 | 52 | 5 | — | 12.0 | G2 | 52 | 48 | 2 | — | 11.0 |
| Example 8 | G1 | 48 | 52 | 5 | — | 12.0 | G3 | 52 | 48 | 2 | — | 11.0 |
| Example 9 | G1 | 48 | 52 | 5 | — | 12.0 | G1 | 50 | 50 | 2 | — | 11.0 |
| Example 10 | G1 | 48 | 52 | 5 | — | 12.0 | G3 | 50 | 50 | 2 | — | 11.0 |
| Example 11 | G3 | 48 | 52 | 5 | — | 12.0 | G1 | 52 | 48 | 2 | — | 11.0 |
| Example 12 | G3 | 48 | 52 | 5 | — | 12.0 | G1 | 50 | 50 | 2 | — | 11.0 |
| Example 13 | G3 | 50 | 50 | 5 | — | 12.0 | G1 | 50 | 50 | 1 | — | 11.0 |
| Example 14 | G3 | 48 | 52 | 5 | — | 12.0 | G1 | 48 | 52 | 2 | — | 11.0 |
| Example 15 | G3 | 52 | 48 | 5 | — | 12.0 | G1 | 52 | 48 | 2 | — | 11.0 |
| Example 16 | G1 | 48 | 52 | 10 | — | 12.0 | G1 | 52 | 48 | 2 | — | 11.0 |
| Comparative Example 3 | G1 | 48 | 52 | 11 | — | 12.0 | G1 | 52 | 48 | 2 | — | 11.0 |
| Comparative Example 4 | G1 | 48 | 52 | — | 1 | 12.0 | G1 | 52 | 48 | — | — | 11.0 |
| Example 17 | G1 | 48 | 52 | — | 3 | 12.0 | G1 | 52 | 48 | — | 1 | 11.0 |
| Example 18 | G1 | 48 | 52 | — | 5 | 12.0 | G1 | 52 | 48 | — | 2 | 11.0 |
| Example 19 | G1 | 48 | 52 | — | 5 | 12.0 | G1 | 52 | 48 | — | 4 | 11.0 |
| Example 20 | G1 | 48 | 52 | — | 10 | 12.0 | G1 | 52 | 48 | — | 2 | 11.0 |
| Comparative Example 5 | G1 | 48 | 52 | — | 11 | 12.0 | G1 | 52 | 48 | — | 2 | 11.0 |

Separately from the above, a solvent, a dispersant, a binder, and a plasticizer were blended with an $Al_2O_3$ powder and mixed together to obtain a slurry. The obtained slurry was applied to a PET film to produce a restraint ceramic green sheet having a thickness of 50 μm.

A Ag powder, a solvent, and an organic binder were mixed with each other in predetermined proportions. The mixture was subjected to dispersion treatment by using a three-roller mill to obtain a Ag paste.

Next, a certain surface ceramic green sheet and a certain internal ceramic green sheet were subjected to a via-hole processing by using a laser puncher. After this, the Ag paste was filled to form a paste body that is to be a via-hole conductor. The Ag paste was applied by screen printing to a certain surface ceramic green sheet to form a paste pattern that provides surface layer electrodes. The Ag paste was applied by screen printing to a certain internal ceramic green sheet to form a paste pattern that provides internal conductors. A plurality of such surface ceramic green sheets and internal ceramic green sheets were laminated, and restraint ceramic green sheets are each disposed on the top and bottom of the laminate, and pressure bonding was performed to produce a composite multilayer body.

The produced composite multilayer body was fired at a temperature at which the surface ceramic green sheets, the internal ceramic green sheets, and the Ag paste were sintered and at which the restraint ceramic green sheets were not sintered. After firing, unsintered portions derived from the restraint ceramic green sheets were removed to produce a multilayer ceramic substrate for evaluation.

Figure 3:
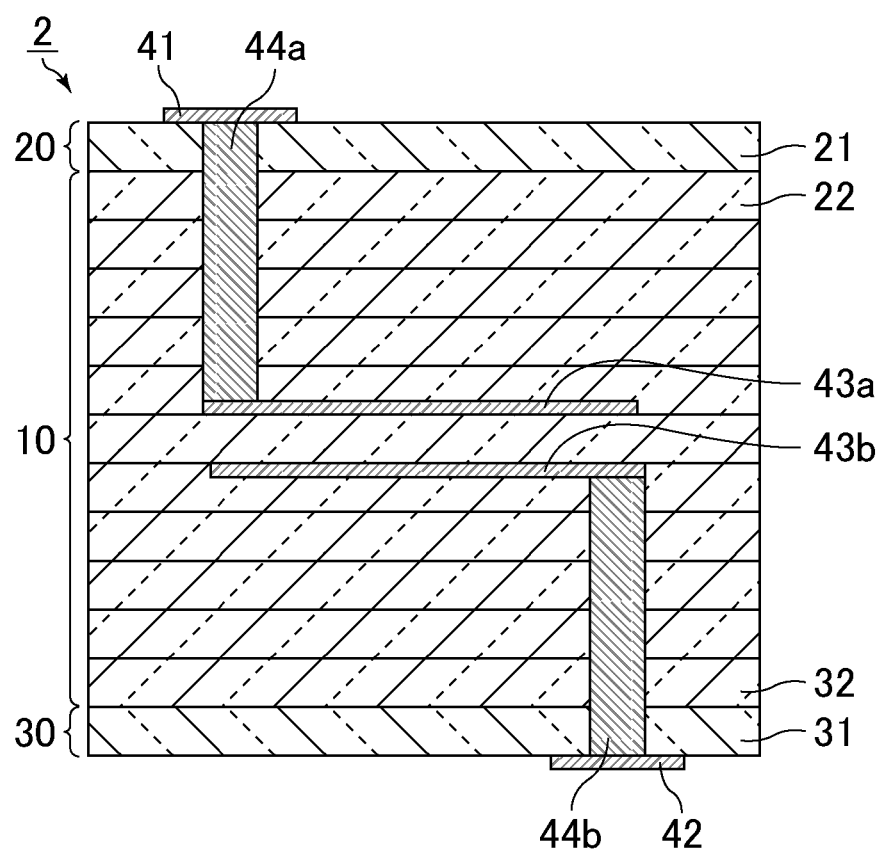
FIG. 3 is a schematic cross-sectional view of a multilayer ceramic substrate for evaluation.

FIG. 3 is a schematic cross-sectional view of a multilayer ceramic substrate for evaluation.

A multilayer ceramic substrate 2 for evaluation includes a multilayer structure in which the first layer 21 in the surface layer portion 20 is bonded to the second layer 22 positioned on the front surface of the internal layer portion 10 and in which the first layer 31 in the surface layer portion 30 is bonded to the second layer 32 positioned on the back surface of the internal layer portion 10. In the substrate, two via-hole conductors, 44a and 44b, are formed. The via-hole conductor 44a is connected to the surface layer electrode 41, which is formed on the first layer 21 on the front side of the substrate, and an internal conductor 43a, which is formed between layers constituting the internal layer portion 10. The via-hole conductor 44b is connected to the surface layer electrode 42, which is formed on the first layer 31 on the back side of the substrate, and an internal conductor 43b, which is formed between layers constituting the internal layer portion 10. The internal conductor 43a connected to the via-hole conductor 44a is separated from the internal conductor 43b connected to the via-hole conductor 44b by the thickness of one ceramic layer constituting the internal layer portion 10.

(Evaluation of Multilayer Ceramic Substrates)

Regarding the multilayer ceramic substrates for evaluation, "difference in thermal expansion coefficient", "insulating property of internal layer portion", "disconnection of surface layer electrode", "flexural strength", and "delamination" were evaluated. Evaluation results are shown in Table 3.

"Difference in thermal expansion coefficient" was determined from the thermal expansion coefficient α1 of the first layer and thermal expansion coefficient α2 of the second layer in the multilayer ceramic substrate for evaluation.

The thermal expansion coefficient was measured by thermomechanical analysis (TMA) with the temperature raised from room temperature to 500° C. at a rate of 5° C./min under the following conditions.

Measurement atmosphere: nitrogen (300 mL/min)
Measurement load: 10 gf

"Insulating property of internal layer portion" was measured by performing an insulating property test in which the surface layer electrode on the front surface and the surface layer electrode on the back surface of a multilayer ceramic substrate for evaluation were used as terminals. In a pressure cooker test, a direct-current voltage of 50 V was applied, and the insulation resistance was measured after 200 hours. The test conditions were 121° C. and 85% RH. After the pressure cooker test, a direct-current voltage of 50 V was applied to each sample for 60 seconds, and leak current was measured. Samples showing Log IR≥10 were evaluated as G (Good), and samples showing Log IR<10 were evaluated as P (Poor). A ceramic layer sandwiched by internal conductors used to measure the insulation resistance has a thickness of 11.0 μm without the internal conductors after firing, as shown in Table 2.

a three-point bend method. Separately from the above, a sample constituted by only surface layer portions and a sample constituted by only internal layer portions were produced. The flexural strength of such samples was measured by a three-point bend method. The flexural strength of a surface layer portion, an internal layer portion, and a substrate (the whole sintered body) was measured by using the above-described samples. In a case where the flexural strength of a substrate is equal to or higher than the flexural strength of an internal layer portion, the case was evaluated as G (Good). In a case where the flexural strength of a substrate is lower than the flexural strength of an internal layer portion, the case was evaluated as P (Poor).

"Delamination" was evaluated by observing the presence of delamination between layers in a cross section of a multilayer ceramic substrate for evaluation by using a metallurgical microscope at a magnification of ×200. In a case where delamination was not observed in 100 samples, the case was evaluated as G (Good). In a case where delamination was observed in one sample, the case was evaluated as P (Poor).

TABLE 3

| | Thermal expansion coefficient [ppmK$^{-1}$] | | | Insulating property of internal layer portion | | Disconnection of surface layer electrode | Flexural strength [MPa] | | | | |
|---|---|---|---|---|---|---|---|---|---|---|---|
| | First layer (α1) | Second layer (α2) | Difference α2 − α1 | LogIR [Ω] | Evaluation | | Surface layer portion | Internal layer portion | Substrate | Evaluation | Delamination |
| Comparative Example 1 | 6.0 | 7.4 | 1.4 | 7 | P | P | 340 | 350 | 400 | G | G |
| Comparative Example 2 | 6.0 | 7.4 | 1.4 | 7 | P | P | 340 | 350 | 400 | G | G |
| Example 1 | 6.2 | 7.4 | 1.2 | 11 | G | G | 335 | 345 | 395 | G | G |
| Example 2 | 6.2 | 7.5 | 1.3 | 11 | G | G | 335 | 340 | 390 | G | G |
| Example 3 | 6.2 | 7.5 | 1.3 | 7 | P | G | 335 | 340 | 390 | G | G |
| Example 4 | 7.6 | 7.9 | 0.3 | 11 | G | G | 340 | 350 | 410 | G | G |
| Example 5 | 5.4 | 5.8 | 0.4 | 11 | G | G | 320 | 325 | 370 | G | G |
| Example 6 | 6.3 | 7.5 | 1.2 | 11 | G | G | 335 | 340 | 390 | G | G |
| Example 7 | 6.3 | 7.2 | 0.9 | 11 | G | G | 335 | 340 | 390 | G | G |
| Example 8 | 6.3 | 7.1 | 0.8 | 11 | G | G | 335 | 340 | 390 | G | G |
| Example 9 | 6.3 | 6.6 | 0.3 | 11 | G | G | 335 | 340 | 390 | G | G |
| Example 10 | 6.3 | 6.4 | 0.1 | 11 | G | G | 335 | 340 | 335 | P | G |
| Example 11 | 5.7 | 7.5 | 1.8 | 11 | G | G | 325 | 340 | 370 | G | P |
| Example 12 | 5.9 | 6.4 | 0.5 | 11 | G | G | 325 | 345 | 400 | G | G |
| Example 13 | 6.2 | 6.5 | 0.3 | 11 | G | G | 340 | 345 | 400 | G | G |
| Example 14 | 5.9 | 6.2 | 0.3 | 11 | G | G | 325 | 320 | 380 | G | G |
| Example 15 | 7.3 | 7.6 | 0.3 | 11 | G | G | 340 | 340 | 410 | G | G |
| Example 16 | 6.6 | 7.5 | 0.9 | 11 | G | G | 335 | 340 | 390 | G | G |
| Comparative Example 3 | 6.6 | 7.5 | 0.9 | 11 | G | P | 310 | 340 | 370 | G | G |
| Comparative Example 4 | 6.1 | 7.4 | 1.3 | 7 | P | P | 340 | 350 | 400 | G | G |
| Example 17 | 6.1 | 7.4 | 1.3 | 11 | G | G | 335 | 340 | 390 | G | G |
| Example 18 | 6.2 | 7.5 | 1.3 | 11 | G | G | 335 | 340 | 390 | G | G |
| Example 19 | 6.2 | 7.5 | 1.3 | 8 | P | G | 335 | 340 | 390 | G | G |
| Example 20 | 6.5 | 7.5 | 1.0 | 11 | G | G | 335 | 340 | 390 | G | G |
| Comparative Example 5 | 6.5 | 7.5 | 1.0 | 11 | G | P | 335 | 340 | 390 | G | G |

"Disconnection of surface layer electrode" was evaluated by observing the presence or absence of the connection between the ends of the surface layer electrode on the front side of a multilayer ceramic substrate for evaluation by using a tester. In a case where the connection was present, the case was evaluated as G (Good). In a case where the connection was absent, the case was evaluated as P (Poor).

Regarding "flexural strength", the flexural strength of a multilayer ceramic substrate for evaluation was measured by As shown in Tables 2 and 3, disconnection of a surface layer electrode did not occur in Examples 1 to 16 in which the materials forming the first layer and the second layer each contain a metal oxide, CuO, and in which the amount of CuO is 1 weight % to 10 weight % relative to the total weight of the glass and the alumina. From the results of Examples 1 to 16, it has been found that even when the composition ratio of glass and the amount of alumina or the metal oxide are changed, the effect of suppressing disconnection of the surface layer electrode is obtained.

In particular, in each of Examples 1, 2, 4 to 9, and 12 to 16, the insulating property of the internal layer portion is reliably obtained, the flexural strength of the substrate is higher than the flexural strength of the internal layer portion, and delamination does not occur.

In Example 3, in which the amount of CuO in the first layer is less than the amount of CuO in the second layer, disconnection of the surface layer electrode does not occur; however, the insulating property of the internal layer portion is decreased.

In Example 10, in which the difference in thermal expansion coefficient between the first layer and the second layer, α2−α1, is 0.1, disconnection of the surface layer electrode does not occur; however, the flexural strength of the substrate is lower than the flexural strength of the internal layer portion.

In Example 11, in which the difference in thermal expansion coefficient between the first layer and the second layer, α2−α1, is 1.8, disconnection of the surface layer electrode does not occur; however, delamination occurs.

On the other hand, in Comparative Example 1, in which the materials forming the first layer and the second layer do not contain a metal oxide, neither CuO nor $Ag_2O$, disconnection of the surface layer electrode occurs, and the insulating property of the internal layer portion is decreased. In Comparative Example 2, in which the material forming the first layer contains a metal oxide, CuO, and in which the material for forming the second layer does not contain a metal oxide, vitrification is not sufficiently promoted. Thus, disconnection of the surface layer electrode occurs, and the insulating property of the internal layer portion is decreased. In Comparative Example 3, in which the amount of CuO in the first layer is 11 weight %, disconnection of the surface layer electrode occurs.

In each of Examples 17 to 20, in which the materials forming the first layer and the second layer each contain a metal oxide, $Ag_2O$, and in which the amount of $Ag_2O$ is 1 weight % to 10 weight % relative to the total weight of the glass and the alumina, disconnection of the surface layer electrode does not occur. From the results of the Examples 17 to 20, it has been found that, as is the case with CuO, when $Ag_2O$ is used as a metal oxide, the effect of suppressing disconnection of the surface layer electrode is obtained.

In particular, in each of Examples 17, 18, and 20, the insulating property of the internal layer portion is reliably obtained, the flexural strength of the substrate is higher than the flexural strength of the internal layer portion, and delamination does not occur.

In Example 19, in which the amount of $Ag_2O$ in the second layer is 4 weight %, the insulating property of the internal layer portion is decreased.

On the other hand, in Comparative Example 4, in which the material forming the first layer contains a metal oxide, $Ag_2O$, and in which the material forming the second layer does not contain a metal oxide, vitrification is not sufficiently promoted. Thus, disconnection of the surface layer electrode occurs, and the insulating property of the internal layer portion is decreased. In Comparative Example 5, in which the amount of $Ag_2O$ in the first layer is 11 weight %, disconnection of the surface layer electrode occurs.

REFERENCE SIGNS LIST

A electronic device
1, 2 multilayer ceramic substrate
10 internal layer portion
20, 30 surface layer portion
21, 31 first layer
22, 32 second layer
41, 42 surface layer electrode
43, 43a, 43b internal conductor
44, 44a, 44b via-hole conductor
100 composite multilayer body
110 internal ceramic green sheet
120, 130 surface ceramic green sheet
151, 152 restraint ceramic green sheet

The invention claimed is:

1. A multilayer ceramic substrate comprising:
a surface layer portion including a first layer;
an internal layer portion including a second layer and positioned inward of the surface layer portion and such that the first layer of the surface layer portion is next to the second layer of the internal layer portion; and
a surface layer electrode on a surface of the surface layer portion,
wherein a first thermal expansion coefficient of the first layer is lower than a second thermal expansion coefficient of the second layer,
the first layer and the second layer each contain:
a glass containing 40 weight % to 65 weight % of MO relative to a total weight of the glass, wherein MO is at least one selected from CaO, MgO, SrO, and/or BaO,
35 weight % to 60 weight % of alumina relative to a total weight of the glass and the alumina,
1 weight % to 10 weight % of at least one metal oxide selected from CuO and/or $Ag_2O$ relative to a total weight of the glass and the alumina, and
a first amount of the metal oxide in the first layer is more than a second amount of the metal oxide in the second layer.

2. The multilayer ceramic substrate according to claim 1, wherein MO is CaO and the CaO is contained in the glass at 40 weight % to 55 weight % relative to the total weight of the glass.

3. The multilayer ceramic substrate according to claim 2, wherein the CaO is contained in the glass at 41 weight % to 50 weight % relative to the total weight of the glass.

4. The multilayer ceramic substrate according to claim 1, wherein the glass further contains 0 weight % to 10 weight % of $Al_2O_3$, 0 weight % to 20 weight % of $B_2O_3$, and 25 weight % to 70 weight % $SiO_2$.

5. The multilayer ceramic substrate according to claim 1, wherein the first layer and the second layer contain the same metal oxide.

6. The multilayer ceramic substrate according to claim 1, wherein the first layer and the second layer contain different metal oxides.

7. The multilayer ceramic substrate according to claim 1, wherein the first layer contains 3 weight % to 5 weight % of the metal oxide relative to the total weight of the glass and the alumina, and the second layer contains 1 weight % to 2 weight % of the metal oxide relative to the total weight of the glass and the alumina.

8. The multilayer ceramic substrate according to claim 1, wherein the first layer and the second layer each contain 48 weight % to 60 weight % of the alumina.

9. The multilayer ceramic substrate according to claim 1, wherein when the first thermal expansion coefficient of the first layer is denoted by α1 ($ppmK^{-1}$) and the second thermal expansion coefficient of the second layer is denoted by α2 ($ppmK^{-1}$), 0.3≤α2−α1≤1.5.

10. The multilayer ceramic substrate according to claim 9, wherein $0.4 \leq \alpha 2 - \alpha 1 \leq 1.4$.

11. The multilayer ceramic substrate according to claim 9, wherein $0.5 \leq \alpha 2 - \alpha 1 \leq 1.3$.

12. The multilayer ceramic substrate according to claim 9, wherein $5.0 \leq \alpha 1 \leq 8.0$.

13. The multilayer ceramic substrate according to claim 12, wherein $5.3 \leq \alpha 1 \leq 7.7$.

14. The multilayer ceramic substrate according to claim 9, wherein $5.5 \leq \alpha 2 \leq 8.5$.

15. The multilayer ceramic substrate according to claim 9, wherein $5.7 \leq \alpha 2 \leq 8.0$.

16. The multilayer ceramic substrate according to claim 9, wherein $5.0 \leq \alpha 1 \leq 8.0$ and $5.5 \leq \alpha 2 \leq 8.5$.

17. The multilayer ceramic substrate according to claim 9, wherein $5.3 \leq \alpha 1 \leq 7.7$ and $5.7 \leq \alpha 2 \leq 8.0$.

18. An electronic device comprising the multilayer ceramic substrate according to claim 1.

\* \* \* \* \*